United States Patent [19]

George

[11] 4,228,522
[45] Oct. 14, 1980

[54] BUBBLE MEMORY WITH REDUNDANT ON CHIP ERROR MAP STORAGE LOOPS

[75] Inventor: Peter K. George, Santa Clara, Calif.

[73] Assignee: National Semiconductor Corporation, Santa Clara, Calif.

[21] Appl. No.: 3,651

[22] Filed: Jan. 15, 1979

[51] Int. Cl.² ............................................. G11C 19/08
[52] U.S. Cl. ....................................... 365/15; 365/12
[58] Field of Search ................................. 365/15, 200

[56] References Cited

U.S. PATENT DOCUMENTS

| 4,125,875 | 11/1978 | Saito ........................................ 365/15 |
| 4,159,412 | 6/1979 | Naden et al. ............................. 365/15 |

FOREIGN PATENT DOCUMENTS 2804695 8/1978 Fed. Rep. of Germany ............. 365/15

Primary Examiner—James W. Moffitt
Attorney, Agent, or Firm—Brown & Martin

[57] ABSTRACT

Disclosed is a magnetic bubble memory that includes a plurality of minor loops for storing bubbles representative of data therein, and a pair of minor loops for storing bubbles representative of an error map therein. The error map is selectively written into and read from only one loop of the pair. The other loop is redundant and improves chip yield. A serial-parallel bubble propagation path connects all of the loops to a bubble generator. This path includes a predetermined number of bubble propagation elements between the transfer-in gates for the pair of loops. Proper choice of the number of propagation elements enables the error map to be selectively written into/read from only one loop of the pair with only a single control line.

10 Claims, 7 Drawing Figures

Fig. 3

|    | G1 | P  | P  | G2 | P  | G3 | P  | G4 |
|----|----|----|----|----|----|----|----|----|
| t1 | X  | X  | X  | B1 | X  | B2 | X  | B3 |
| t2 | X  | X  | B1 | X  | B2 | X  | B3 | X  |
| t3 | X  | B1 | X  | B2 | X  | B3 | X  | B4 |
| t4 | B1 | X  | B2 | X  | B3 | X  | B4 | X  |
| t5 | X  | B2 | X  | B3 | X  | B4 | X  | B5 |
| t6 | B2 | X  | B3 | X  | B4 | X  | B5 | X  |
| t7 | X  | B3 | X  | B4 | X  | B5 | X  | B6 |
| t8 | B3 | X  | B4 | X  | B5 | X  | B6 | X  |

Fig. 4

|     | G1 | P  | P  | P  | P  | G2 | P  | G3 | P  | G4 |
|-----|----|----|----|----|----|----|----|----|----|----|
| t11 | X  | X  | X  | X  | X  | B1 | X  | B2 | X  | B3 |
| t12 | X  | X  | X  | X  | B1 | X  | B2 | X  | B3 | X  |
| t13 | X  | X  | X  | B1 | X  | B2 | X  | B3 | X  | B4 |
| t14 | X  | X  | B1 | X  | B2 | X  | B3 | X  | B4 | X  |
| t15 | X  | B1 | X  | B2 | X  | B3 | X  | B4 | X  | B5 |
| t16 | B1 | X  | B2 | X  | B3 | X  | B4 | X  | B5 | X  |
| t17 | X  | B2 | X  | B3 | X  | B4 | X  | B5 | X  | B6 |
| t18 | B2 | X  | B3 | X  | B4 | X  | B5 | X  | B6 | X  |

Fig. 5

|     | G1 | G2 | P  | G3 | P  | G4 | P  |
|-----|----|----|----|----|----|----|----|
| t21 | X  | X  | B1 | X  | B2 | X  | B3 |
| t22 | X  | B1 | X  | B2 | X  | B3 | X  |
| t23 | B1 | X  | B2 | X  | B3 | X  | B4 |
| t24 | X  | B2 | X  | B3 | X  | B4 | X  |
| t25 | B2 | X  | B3 | X  | B4 | X  | B5 |
| t26 | X  | B3 | X  | B4 | X  | B5 | X  |
| t27 | B3 | X  | B4 | X  | B5 | X  | B6 |
| t28 | X  | B4 | X  | B5 | X  | B6 | X  |

Fig. 6

|     | G1 | P  | G2 | P  | G3 | P  | G4 | P  |
|-----|----|----|----|----|----|----|----|----|
| t31 | X  | X  | B1 | X  | X  | B2 | X  | X  |
| t32 | X  | B1 | X  | X  | B2 | X  | X  | B3 |
| t33 | B1 | X  | X  | B2 | X  | X  | B3 | X  |
| t34 | X  | X  | B2 | X  | X  | B3 | X  | X  |
| t35 | X  | B2 | X  | X  | B3 | X  | X  | B4 |
| t36 | B2 | X  | X  | B3 | X  | X  | B4 | X  |
| t37 | X  | X  | B3 | X  | X  | B4 | X  | X  |
| t38 | X  | B3 | X  | X  | B4 | X  | X  | B5 |
| t39 | B3 | X  | X  | B4 | X  | X  | B5 | X  |

O X O X O · · O X O 1 X M$_1$ X M$_2$ X M$_3$ X · · · · X M$_N$ X O X O X O X O X

↑ START BIT    ↑ CODE BIT

Fig. 7

BUBBLE MEMORY WITH REDUNDANT ON CHIP ERROR MAP STORAGE LOOPS

BACKGROUND OF THE INVENTION

This invention relates to bubble memories, and more particularly to methods and apparatus for dealing with defective minor loops in the memory. Presently, the most popular architecture for a bubble memory includes a plurality of minor loops for storing bubbles representative of data therein. The bubbles are written into these minor loops and read therefrom in response to control signals applied to the memory. However, due to a variety of reasons, a small number of the loops, such as five or ten percent, typically are defective. These defects may be due to flaws in the garnet film in which the bubbles are formed. They may also be due for example, to permalloy defects arising from dust which enter the memory during the lithography stage of its fabrication.

Thus, in order to construct high yield bubble memory chips, it is necessary to provide extra minor loops on the chip. Then, during final chip testing, the defective loops are determined; and this information is subsequently used to control which loops are actually used to store bubbles.

In the prior art, defective loops were identified to the user by stamping a defective loop may on each of the chips. The user would then encode this information into a read only memory (ROM). And the ROM was then used in conjunction with other control logic to mask out the defective loops during a write or read operation.

More recently, some bubble memories have included a single extra loop on the chip for storing error map information therein. The user is thus able to read the error map from the memory during system initialization and store that map in a RAM. The RAM is then used in conjunction with control logic to mask out the defective loops during a write or read operation.

Both of the above approaches however, have certain deficiencies. For example, with ROM approach, each memory system requires unique parts. That is, the ROM for one memory system cannot be used as the ROM in another memory system because the bubble memory chips in each memory system have a different defective minor loops. Further, when a bubble chip in a memory system goes completely bad, due to aging for example, the replacement of the bubble chip also necessitates the replacement of the ROM.

Similarly, one problem with the prior art bubble memory chips that provide an on-chip error map is that they include no redundant error map loops. That is, they include only a single error map loop. Therefore, if that loop is defective, due to any of the above described processing problems, then the entire chip must be discarded. Thus, the production yield of those bubble memory chips is undesirably low.

It is therefore desirable to provide redundant error map loops on the bubble memory chip. However, this raises the question of how the redundant error map loops can be selectively written into and read from. Clearly, one approach is to provide separate transfer-in control lines and separate replicate-out/transfer-out control lines for each of the redundant loops. However, the problem with that approach is that it takes too many pins. For example, two error map loops having separate input and output control lines require eight extra pins; and these pins in combination with the pins required to operate the data storage loops would make the chip prohibitively large.

Therefore, it is one object of the invention to provide an improved bubble memory chip having redundant error map storage loops with selection controls that do not require a prohibitive number of extra pins.

Another object of the invention is to provide a bubble memory chip having two redundant error map loops that are separately selectable with only two extra pins.

SUMMARY OF THE INVENTION

These and other objects are accomplished in accordance with the invention of a bubble memory chip that includes one plurality of minor loops for storing bubbles representative of data therein, and one pair of minor loops for storing bubbles representative of an error map therein. The memory also includes a bubble generator for generating bubbles for storage in the loops in response to "generate" control signals. A serial-parallel bubble propagation path directs bubbles from the bubble generator to respective inputs of all the minor loops.

The serial portion of the path includes a plurality of transfer-in gates having one transfer-in control line for directing bubbles to the plurality of minor loops; and further includes a pair of transfer-in gates having another transfer-in control line for directing bubbles to the pair of minor loops. Predetermined quantities of bubble propagation elements lie between the pair of transfer-in gates.

As a result, the pair of transfer-in gates are spaced such that consecutive bubbles in the error map bit pattern never simultaneously lie under both transfer-in gates of the pair.

In one preferred embodiment, consecutive bubbles in the error map bit pattern are spaced by one bubble propagation elements and the pair of transfer in gates are spaced by either zero, two or four bubble propagation elements. In another preferred embodiment, consecutive bubbles in the error map bit pattern are spaced by two bubble propagation elements and the pair of transfer-in gates is spaced by either zero, one, or three bubble propagation elements.

BRIEF DESCRIPTION OF THE DRAWINGS

Various preferred embodiments of the invention will best be understood by reference to the following detailed description when read in conjunction with the accompanying drawings wherein:

FIG. 3 is a timing diagram illustrating the operation of the memory of FIG. 2.

FIG. 4 is a timing diagram illustrating the operation of a modified version of the FIG. 2 memory.

FIG. 5 is a timing diagram illustrating the operation of another modified version of the FIG. 2 memory.

FIG. 6 is a timing diagram illustrating the operation of still another modified version of the FIG. 2 memory.

FIG. 7 is a diagram of one preferred format for the error map code for the FIG. 1 memory.

DETAILED DESCRIPTION

A preferred embodiment of the invention will now be described in conjunction with FIG. 1. As therein illustrated, this embodiment includes a plurality of minor loops 10-1 through 10-N. Magnetic bubbles representative of data are stored in these loops, which are hereinafter referred to as data loops.

The disclosed invention also includes a pair of minor loops 11-1 and 11-2. Magnetic bubbles representative of an error map are stored in one of these loops, which are hereinafter referred to as error map loops. The error map indicates which of the data loops are defective. Defective data loops are caused by any of the processing problems that were pointed out in the background portion of this disclosure.

Due to the same causes, either one of the error map loops may be defective. This poses no problem however, since the error map loops are redundant. That is, the error map is stored in only one of the loops 11-1 or 11-2. And the two loops are provided to improve chip yield.

In order to load bubbles into the above described loops, the disclosed invention includes a bubble generator 12, a serial-parallel bubble propagation path 13, and transfer-in lines 14 and 15. Generator 12 produces bubbles on the serial portion of path 13 in response to "generate" control signals on lead 12a. These bubbles propagate along the serial portion of path 13 in response to a rotating magnetic field. To transfer the bubbles in parallel into all of the data loops, a "transfer-in" control signal is applied to control line 14. And to selectively transfer the bubbles into only one of the error map loops, another "transfer-in" control signal is applied to control line 15.

This selective loading of the error map loops is made possible by the disclosed invention, even though both of those loops have a common transfer-in line 15. A common transfer-in line is desired because it saves pins on the chip. Further details on the selective transfer-in mechanism for the error map loops will be described shortly in conjunction with FIG. 2 through 6.

Figure 1:
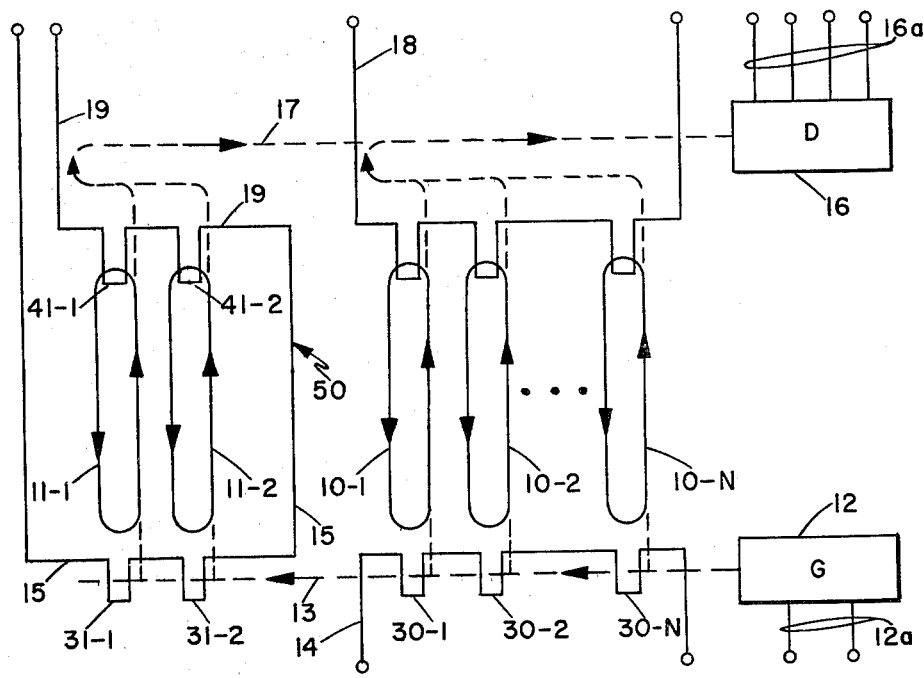
FIG. 1 is a schematic diagram of a bubble memory chip constructed according to the invention.

In order to read bubbles in the above described loops, the FIG. 1 memory chip includes a bubble detector 16, a parallel-serial bubble propagation path 17, and a pair of transfer-out control lines 18 and 19. The application of a transfer-out pulse to control line 18 causes one bubble from each of the data loops to be replicated and transferred to the parallel inputs of path 17. These bubbles are then propagated by a rotating magnetic field to detector 16; and detector 16 operates to generate signals on output leads 16a representative of the bubbles which it receives.

Similarly, the application of a transfer-out pulse to control line 19 causes one bubble from each of the error map loops to be replicated and transferred to the parallel inputs of path 17. And, since only one of these loops have bubbles stored therein, control line 19 may be pulsed once for each rotation of the magnetic field. That is, no loss of information will occur due to merger on the serial portion of path 17, since only one of the loops 41-1 and 41-2 contains bubbles.

Figure 2:
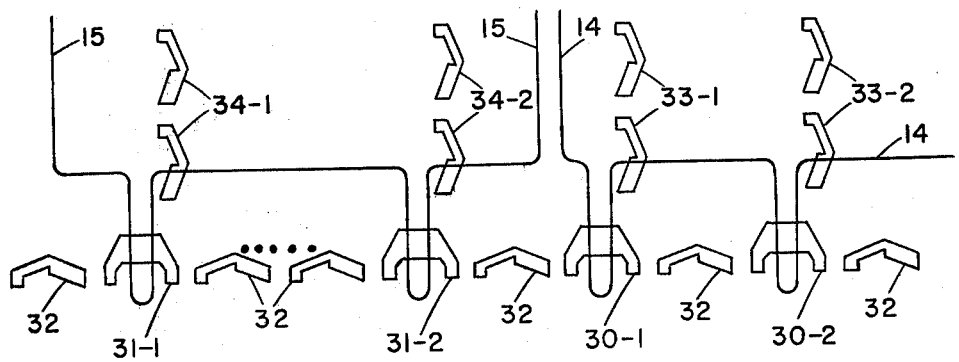
FIG. 2 is a greatly enlarged top view of a portion of the serial-parallel bubble propagation path in the memory of FIG. 1.

Referring now to FIG. 2, a preferred structure for serial-parallel bubble propagation path 13 will be described in detail. This bubble propagation path includes a plurality of transfer-in gates and bubble propagation elements. The former are identified by reference numerals 30-1 through 30-N, 31-1 and 31-2. Each of the data loops 10-1 through 10-N have their own respective transfer-in gates 30-1 through 30-N. Similarly, the pair of error map loops 11-1 and 11-2 have their own respective transfer-in gates 31-1 and 31-2. Consecutive ones of these gates are spaced apart from each other by the bubble propagation elements 32.

The spacing between transfer-in gates 30-1 through 30-N is dictated by the spacing of the data loops 10-1 through 10-N. Preferably, this spacing is as small as possible to allow for a maximum number of data loops. In FIG. 2, only one bubble propagation element lies between consecutive transfer-in gates 30-1 through 30-N.

In comparison, the spacing between transfer-in gates 31-1 and 31-2 for the error loops is not dictated by the layout space required for those loops. Between gates 31-1 and 31-2, extra bubble propagation elements are purposely added to allow loops 34-1 and 34-2 to be selectively loaded. The FIG. 2 embodiment has two bubble propagation elements between gates 31-1 and 31-2. In general however, the quantity of bubble propagation elements that lie between gates 31-1 and 31-2 are chosen such that consecutive bubbles in the error map bit pattern never simultaneously lie under gates 31-1 and 31-2.

In FIG. 2, the series of dots between the two propagation elements 32 which lie between gates 31-1 and 31-2 indicate that the number of such elements between these gates may vary.

The FIG. 2 embodiment is designed to allow bubbles to be selectively loaded into the error map loops on alternative cycles of the rotating magnetic field. Thus, in accordance with the invention, transfer-in gates 31-1 and 31-2 must be spaced such that the number of field rotations required to propagate a bubble between them does not equal 2, 4, 6, . . . etc. This requirement is met by the FIG. 2 embodiment, which takes three field rotations to propagate a bubble between gates 31-1 and 31-2.

FIG. 3 is a timing diagram which illustrates the operation of the FIG. 2 memory. In that figure, the letters G and P respectively represent transfer-in gates and bubble propagation elements. Specifically, $G_1$ represents gate 31-1, $G_2$ represents gate 31-2, $G_3$ represents gate 30-1, and $G_4$ represents gate 30-2. Also in that figure, the letter B represents a bubble and the letter X represents a space between the bubbles.

Due to the above described spacing of gates 31-1 and 31-2, magnetic bubbles never underlie the two gates at the same time instant. This can be seen by inspection of FIG. 3. There, bubbles underlie gate $G_1$ at time instants T4, T6, T8, . . .; whereas bubbles underlie gate $G_2$ at time instants T1, T3, T5, T7, . . . Thus, to transfer bubbles into loop 11-1, transfer-in control line 15 is pulsed at time instants T4, T6, etc. Conversely, to transfer bubbles into loop 11-2, transfer-in line 15 is pulsed at time instants T1, T3, T5 etc.

The similar operation of alternative embodiments of the invention are illustrated in FIGS. 4, 5, and 6. In FIG. 4 for example, consecutive bubbles for the error map loops are again loaded on alternative cycles, but a total of four bubble propagation elements lie between transfer-in gates 31-1 and 31-2. With this embodiment, bubbles are transferred into error map loop 11-1 by applying transfer-in pulses to control line 15 at time instants T16, T18, etc; whereas bubbles are loaded into loop 11-2 by applying signals to control line 15 at time instants T11, T13, etc.

FIG. 5 illustrates the operation of another embodiment of the invention wherein consecutive bubbles for the error map loops are loaded on alternative cycles, but where gates 31-1 and 31-2 are adjacent to each other. Adjacent transfer-in gates for the error map loops are feasible, since the parallel outputs from those gates can diverge to accommodate the loops. In this embodiment, bubbles are transferred into loop 11-1 at time instant T23, T25, whereas bubbles are transferred into loop 11-2 at time instants T22, T24, etc.

In all of the above embodiments, it should be pointed out that the spacing of the bubbles that are loaded into the error map loops is the same as the spacing of the bubbles that are loaded into the data loops. This is desirable because it keeps the timing for bubble generator the same regardless of where the bubbles are being sent for storage. Also, it keeps the timing of a bubble detection sequence the same regardless of whether the bubbles are being read from the data loops on the error map loops.

The operation of another embodiment wherein the spacing of bubbles in the data loops and the error map loops differ, is illustrated in the timing diagram of FIG. 6. There, one propagation element lies between consecutive transfer-in gates of both the data loops and the error map loops. Therefore, the number of field rotations between consecutive bubbles for storage in the data loops is two. But the number of field rotations for consecutive bubbles for storage in the error map loops cannot be two since the bubbles will simultaneously lie under gates G1 and G2. Thus, in the FIG. 6 embodiment, bubbles for the error map loops are separated by three rotations of the magnetic field. Accordingly, loop 11-1 is loaded at time instants T33, T36, T39, etc, whereas loop 11-2 is loaded at time instants T31, T34, T37, etc.

Referring now to FIG. 7, a preferred format for the error map that is stored in loops 11-1 or 11-2 will be described. This format consists of a single "start" bit and a total of N code bits. One code bit exists for each loop. These code bits are illustrated in FIG. 7 as $M_1$, $M_2$, ... $M_N$. The variable M is either 0 or 1, depending upon whether the corresponding loop is defective or non-defective respectively. Since most of the data loops are non-defective, it follows that most of the M code bits will equal 1. Thus, a string of several consecutive zeros will always indicate the gap preceding the code, and the first "one" following this string of zeros indicates where the code bits begin.

Also in the format of FIG. 7, there is a plurality of X's. These X's indicate the spacing between consecutive bits. A single X indicates that the bits are separated by one rotation of the magnetic field. This corresponds to the bit patterns illustrated in FIGS. 3, 4, and 5.

In one preferred embodiment of the invention, the transfer-in gates 31-1 and 31-2 and transfer-out gates 41-1 and 41-2 of the error map storage loops are separated from each other such that bubbles never lie under the two gates simultaneously. This is achieved by constructing loops 11-1 and 11-2 such that the number of field rotations required to propagate a bubble from the transfer-in gates to the transfer-out gate of those loops is not equal to any integer multiple of the spacing between consecutive bubbles in the error map. Under those conditions, when a bubble lies under gate 31-2 for example, a space will lie under transfer-out gate 41-1. Similarly, when a bubble lies under gate 31-1, a space will lie under transfer-out gate 41-2.

The above architecture then allows transfer-in line 15 and transfer-out line 19 to be serially connected on the memory chip. As a result, the number of pins on the chip that would otherwise be required is reduced by two. The serial interconnection of control lines 15 and 19 is illustrated in FIG. 1 at point 50.

In still another preferred embodiment, loops 11-1 and 11-2 are constructed such that there are more bubble storage locations between transfer-in gates 31-1 and 31-2 and transfer-out gates 41-1 and 41-2, than there are data loops. Suppose for example, that the memory included 260 data loops. In that case, by providing at least 260 locations for storing bubbles between gates 31-1 and 41-1, the entire error map can be loaded before the first bit of the error map reach the transfer-out gate. Thus, no conflict in timing occurs between the writing and reading of bubbles to/from the error storage loops.

Various preferred embodiments of the invention have now been described in detail. In addition, many changes and modifications can be made thereto without departing from the nature and spirit of the invention. Thus, it is to be understood that the invention is not limited to said details, but is defined by the appended claims.

I claim:

1. A magnetic bubble memory chip comprised of;
   one plurality of data loops, some of which may be defective, for storing magnetic bubbles representative of data bits;
   a pair of error map loops, one of which may be defective, for selectively storing an error map containing magnetic bubbles that are respectively spaced apart by $N_1$ magnetic field rotations where $N_1$ is any integer greater than or equal to two;
   a bubble generator for generating bubbles for said data loops and said error map loops in response to control signals applied thereto;
   a serial-parallel bubble propagation path having a serial input for receiving bubbles from said generator and having parallel outputs respectively connected to each of said data loops and error map loops;
   the serial portion of said serial-parallel path including respective transfer-in gates for said error map loops, a single transfer-in control line for said gates, and $N_2$ magnetic bubble propagation elements lying between said gates where $N_2$ is any positive integer not equal to $KN_1-1$ and where $K = 1, 2, ...$ 2. A memory chip according to claim 1 wherein $N_1$ equals two, and wherein $N_2$ equals either 0, 2, or 4.

3. A memory chip according to claim 1 wherein $N_1$ equals three, and wherein $N_2$ equals either 0, 1, 3, or 4.

4. A memory chip according to claim 1 and further including a parallel-serial bubble propagation path having parallel inputs connected respectively to each of said data loops and said error map loops;
   the parallel portion of said parallel-serial path including transfer-out/replicate gates for each of said error map loops and a single transfer-out/replicate control line for said transfer-out/replicate gates.

5. A memory chip according to claim 4 wherein said transfer-in control line and said transfer-out control line are serially interconnected on said chip and together use only two pins.

6. A memory chip according to claim 4 where the number of bubbles that can be stored between said transfer-in gates and transfer-out/replicate gates of either error-map loop is greater than the number of said data loops.

7. A memory chip according to claim 4 wherein said transfer-in gates and transfer-out/replicate gates are spaced with bubble propagation elements such that the number of magnetic field rotations required to propagate a bubble from said transfer-in gates to said transfer-out/replicate gates is not equal to an integer multiple of the number of field rotations required to propagate a bubble between said transfer-in gates.

8. A method of constructing a bubble memory chip having redundant error map loops and a minimal number of pins, said method including the step of:

provide on said chip one plurality of data loops, some of which may be defective, for storing magnetic bubbles representative of data bits;

providing on said chip one pair of error map loops, one of which may be defective, for selectively storing an error map containing magnetic bubbles that are respectively spaced apart by $N_1$ magnetic field rotations where $N_1$ is any integer greater than or equal to two;

providing on said chip a bubble generator for generating bubbles for said data loops and said error map loops in response to control signals applied thereto; and providing on said chip, a serial-parallel bubble propagation path having a serial input for receiving bubbles from said generator and having parallel outputs respectively connected to each of said data loops and error map loops;

the serial portion of said bubble propagation path including respective transfer-in gates for said error map loops, a single transfer-in control line for said gates, and $N_2$ magnetic bubble propagation elements lying between said gates where $N_2$ is any positive integer not equal to $KN_1$-1, and where $K = 1, 2, \ldots$.

9. A method according to claim 8 and further including the step of providing a parallel-serial bubble propagation path having parallel inputs connected respectively to each of said data loops and said error map loops;

the parallel portion of said parallel-serial path including respective transfer-out/replicate gates for each of said error map loops and a single transfer-out/replicate control line for said transfer-out/replicate gates.

10. A method according to claim 9 wherein said transfer-in control line and said transfer-out control line are serially interconnected on said chip and together use only two pins.

* * * * *